United States Patent
Valentine

(10) Patent No.: US 10,764,975 B2
(45) Date of Patent: Sep. 1, 2020

(54) PULSE-WIDTH-MODULATION CONTROL OF MICRO LIGHT EMITTING DIODE

(71) Applicant: Facebook Technologies, LLC, Menlo Park, CA (US)

(72) Inventor: Gareth John Valentine, York (GB)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/942,377

(22) Filed: Mar. 30, 2018

(65) Prior Publication Data

US 2019/0306945 A1 Oct. 3, 2019

(51) Int. Cl.
| | | |
|---|---|---|
| *G09G 3/32* | (2016.01) | |
| *H05B 45/10* | (2020.01) | |
| *H03M 1/82* | (2006.01) | |
| *H03K 7/08* | (2006.01) | |
| *H05B 45/37* | (2020.01) | |

(52) U.S. Cl.
CPC .............. *H05B 45/10* (2020.01); *G09G 3/32* (2013.01); *H03K 7/08* (2013.01); *H03M 1/822* (2013.01); *H05B 45/37* (2020.01); *G09G 2310/027* (2013.01); *G09G 2320/064* (2013.01)

(58) Field of Classification Search
CPC ..... G09G 2320/0233; G09G 2320/064; G09G 2310/027; H05B 33/0845
See application file for complete search history.

(56) References Cited

U.S. PATENT DOCUMENTS

| | | | | |
|---|---|---|---|---|
| 3,116,458 A * | 12/1963 | Margopoulos | ........... | G06G 7/25 327/90 |
| 4,082,445 A * | 4/1978 | Steiner | ............... | G03G 15/0855 399/60 |
| 4,384,199 A * | 5/1983 | Ogino | ...................... | G02B 7/32 250/204 |
| 5,889,503 A * | 3/1999 | Kikuchi | ............... | G09G 3/3611 345/100 |
| 5,973,661 A * | 10/1999 | Kobayashi | ........... | G09G 3/3648 345/100 |
| 6,392,629 B1 * | 5/2002 | Murakami | ........... | G09G 3/2011 345/100 |
| 6,400,101 B1 * | 6/2002 | Biebl | ..................... | H05B 45/18 315/291 |
| 7,710,311 B2 * | 5/2010 | Teshirogi | ................ | G01S 7/032 342/70 |
| 7,791,584 B2 * | 9/2010 | Korcharz | ............... | H05B 45/46 345/101 |
| 8,115,415 B2 * | 2/2012 | Moon | .................... | H05B 45/44 315/307 |
| 8,378,591 B2 * | 2/2013 | Van Herpen | ........... | H05B 47/18 315/299 |

(Continued)

*Primary Examiner* — William Boddie
*Assistant Examiner* — Bipin Gyawali
(74) *Attorney, Agent, or Firm* — Fenwick & West LLP

(57) ABSTRACT

Embodiments relate to a light-emitting-diode (LED) cell that includes a LED and a controller. The controller receives a brightness data signal and generates a driving signal corresponding to the brightness data signal. The controller includes a comparator that receives the brightness data signal and a control waveform signal. The controller is coupled to a switched current source that generates a driving current based on the driving signal.

20 Claims, 8 Drawing Sheets

(56) References Cited

U.S. PATENT DOCUMENTS

| | | | | |
|---|---|---|---|---|
| 8,575,845 B2* | 11/2013 | Hagan | | H05B 45/37 |
| | | | | 315/122 |
| 8,614,551 B2* | 12/2013 | Chen | | H05B 45/10 |
| | | | | 315/200 R |
| 8,946,764 B2* | 2/2015 | Biwa | | H01L 33/025 |
| | | | | 257/101 |
| 9,066,398 B2* | 6/2015 | Zhang | | H05B 45/10 |
| 9,093,607 B2* | 7/2015 | Gilet | | H01L 33/06 |
| 9,282,609 B2* | 3/2016 | Kuang | | H05B 45/37 |
| 9,351,370 B2* | 5/2016 | Malinin | | H05B 45/24 |
| 9,546,318 B2* | 1/2017 | Murphy | | C09K 11/617 |
| 9,620,053 B2* | 4/2017 | Kim | | G09G 3/3233 |
| 9,626,023 B2* | 4/2017 | Ludwig | | G06F 3/0412 |
| 9,699,845 B2* | 7/2017 | Hagino | | H05B 45/46 |
| 9,793,333 B2* | 10/2017 | Lee | | H01L 51/5203 |
| 10,104,728 B2* | 10/2018 | Lee | | H05B 45/3725 |
| 2005/0285822 A1* | 12/2005 | Reddy | | H01L 27/288 |
| | | | | 345/76 |
| 2006/0221047 A1* | 10/2006 | Tanizoe | | G09G 3/3406 |
| | | | | 345/102 |
| 2008/0100224 A1* | 5/2008 | Felder | | H05B 45/10 |
| | | | | 315/151 |
| 2009/0256739 A1* | 10/2009 | Teshirogi | | G01S 7/032 |
| | | | | 342/204 |
| 2009/0284502 A1* | 11/2009 | Hayafuji | | G09G 3/2025 |
| | | | | 345/205 |
| 2011/0037396 A1* | 2/2011 | Chien | | H05B 45/37 |
| | | | | 315/185 R |
| 2013/0082624 A1* | 4/2013 | Brassfield | | H05B 45/10 |
| | | | | 315/297 |
| 2013/0112945 A1* | 5/2013 | Gilet | | H01L 33/06 |
| | | | | 257/13 |
| 2013/0154483 A1* | 6/2013 | Hagan | | H05B 33/0818 |
| | | | | 315/122 |
| 2015/0156836 A1* | 6/2015 | Han | | H05B 45/395 |
| | | | | 315/186 |
| 2017/0188427 A1* | 6/2017 | Cok | | F21K 9/90 |
| 2019/0237001 A1* | 8/2019 | Lin | | G09G 3/2044 |

* cited by examiner

PULSE-WIDTH-MODULATION CONTROL OF MICRO LIGHT EMITTING DIODE

BACKGROUND OF THE INVENTION

1. Field of the Disclosure

The present disclosure relates to controlling the brightness of light emitting diodes (LEDs) and more specifically to using a pulse-width-modulation (PWM) control scheme for controlling the brightness of LEDs.

2. Description of the Related Art

Micro light-emitting diode (μLED) display are an emerging flat panel display technology that includes microscopic light-emitting diodes (LEDs) for displaying images. Compared to liquid crystal display (LCD) technology, μLED display devices offer improved contrast, faster response time, and lower energy consumption.

μLEDs are self-emitting elements that generate light in response to a forward bias current that is provided to the diode. The amount of light emitted by the μLED increases as the amount of current supplied to the μLED increases. In some implementations, μLEDs are driven using a voltage controlled current source which generates a driving current that increases with the increase in the voltage level of a voltage signal. The voltage signal may in turn be generated based on a data signal that specifies the desired brightness of the μLED.

SUMMARY

Embodiments relate to a micro light-emitting-diode (μLED) cell that includes a μLED and a controller. The controller receives a brightness data signal and generates a driving signal corresponding to the brightness data signal. The controller includes a comparator that receives the brightness data signal and a control waveform signal. The controller is coupled to a switched current source that generates a driving current based on the driving signal.

In one or more embodiments, the controller generates a driving signal having a set amplitude and a duty cycle that correspond to a brightness data signal. The current source is coupled to an output of the controller and generates a driving current based on the driving signal generated by the controller. The average amplitude of the driving current is proportional to the brightness data signal. The μLED is coupled to the current source and emits light with an average brightness that is proportional to the driving current.

BRIEF DESCRIPTION OF THE DRAWINGS

The teachings of the embodiments can be readily understood by considering the following detailed description in conjunction with the accompanying drawings.

Figure (FIG.) 1A illustrates a graph showing the internal quantum efficiency with respect to the current density for a conventional LED and a micro LED (μLED).

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Embodiments relate to a control scheme for controlling the brightness of a micro light-emitting-diode (mLED, μLED, or µLED) while increasing the efficiency of the μLED (e.g., operating near or at the peak efficiency of the μLED) by using a digital pulse-width-modulation (PWM) control scheme. During on-times of the PWM scheme, the current density in μLED exceeds a threshold level corresponding to internal quantum efficiency (IQE) that is higher than a threshold efficiency. The current density of the μLED during the on-times of the PWM is higher than the current density of conventional macro LEDs. The off-times of the PWM scheme is controlled so that the average brightness of the μLED reaches the desired level.

Figure 1A:
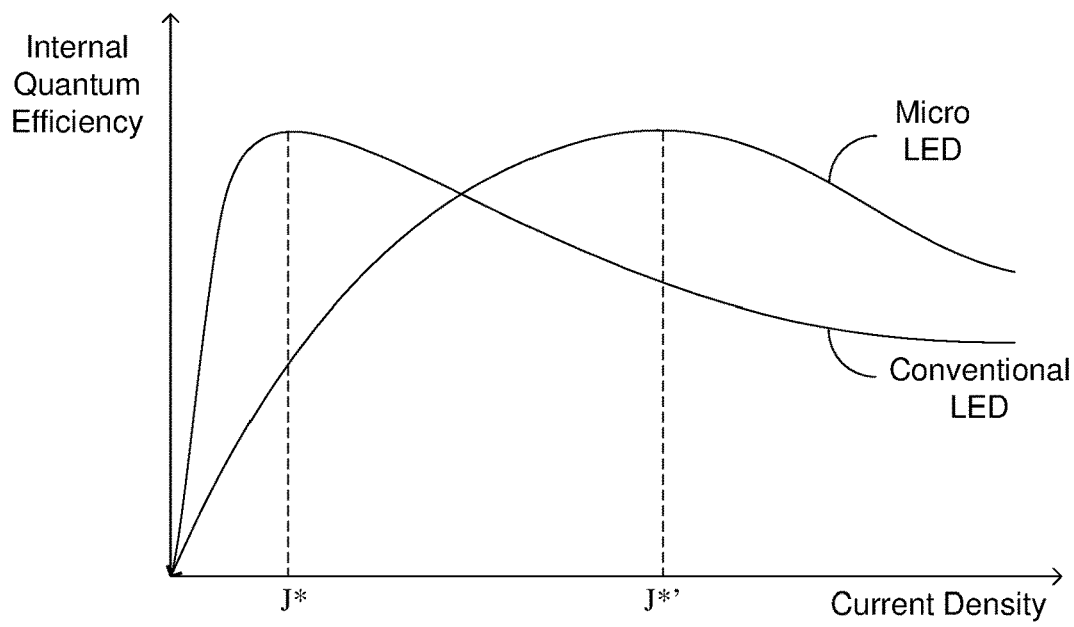
FIG. 1B illustrates a timing diagram when driving an LED with a constant current.
FIG. 1C illustrates a timing diagram for driving a μLED, according to one embodiment.

The internal quantum efficiency (IQE) of light-emitting-diodes (LEDs) changes as a function of the current density in the LED. FIG. 1A illustrates a graph showing the IQE with respect to the current density for a conventional macro LED and a micro LED (μLED). As shown in FIG. 1A, the conventional LEDs reach a peak IQE at a lower current density $J^*$ compared to the peak IQE $J^{*'}$ of μLEDs. As such, conventional LEDs quickly reach an efficient light generation value, even for low current density values. In contrast, μLEDs may have poor IQE when operated at low current density values. That is, since the brightness of a μLED is proportional to the current density used to drive the μLED, compared to conventional LEDs, μLEDs are inefficient at low luminance values if driven at constant current.

Figure 1B:
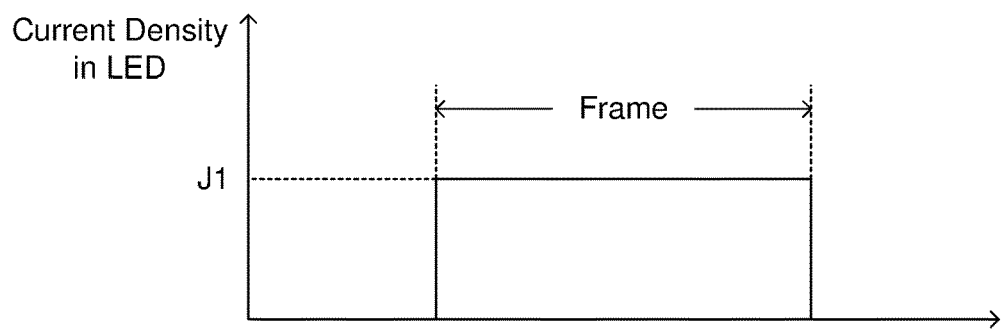

FIG. 1B illustrates a timing diagram when driving an LED with a constant current. Using the driving scheme of FIG. 1B, the μLED is driven with a current J1 corresponding to the desired brightness of the μLED. The current J1 is supplied to the μLED throughout the duration of a cycle (e.g., $\frac{1}{60}^{th}$ of a second). As such, the current used to drive the μLED will vary based on the desired brightness and, the IQE of the μLED will also vary based on the desired brightness of the μLED. As the brightness of the μLED drops, the current density in μLED drops further from $J^{*'}$, causing a decrease in the IQE of the μLED. Furthermore, since the μLED is constantly being driven to emit light, the μLED may not have time to cool down. A further complication arises owing to the steep slope feature of the IQE curve below $J^{*'}$ of a μLED. When operating below $J^{*'}$, small variations in the µLED electrical performance across an array will result in large variations in emitted optical power at identical set driving currents from pixel to pixel because of the large variations in IQE operating below the peak point. Conversely, operating near J*' allows a greater tolerance to small variations in performance without consequential problematic variations in emitted light as the IQE slope is flat in the region around J*'.

Figure 1C:
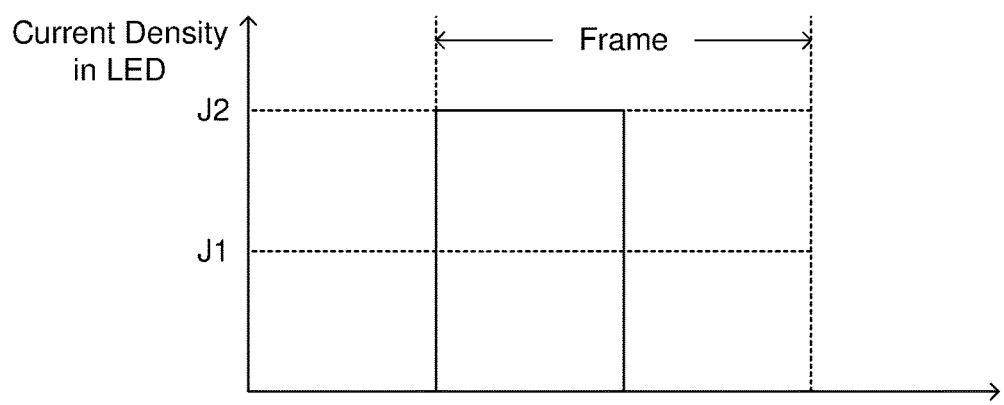

FIG. 1C illustrates a timing diagram for driving a µLED, according to one embodiment. Using the driving scheme of FIG. 1C, the µLED is driven with a preset current J2 regardless of the desired brightness of the µLED. Instead, the perceived brightness of the µLED is controlled by the amount of time the µLED is driven. That is, if a lower brightness is desired, the µLED is driven during a shorter amount of time within one cycle, and if a higher brightness is desired, the µLED is driven during a longer amount of time within one cycle. In the example of FIG. 1C, since the µLED is driven with the current J2 for half of the duration of the cycle, the perceived brightness of the µLED will be half of the brightness of the µLED when the µLED is driven with current J2. Since during the period of time the µLED is being driven, the µLED is supplied the same preset current where the current density in the µLED is above a threshold value $J_{TH}$ closer to J*'(see FIG. 1A), the IQE of the µLED can be better controlled. That is, the current J2 may be selected to so that the µLED operates with current density closer to J*' and achieving a higher IQE. Thus, achieving improved operational uniformity across a display device.

A challenge with implementing a standard fully digital PWM scheme where a multibit digital signal specifies the pulse width of a constant current signal that is applied to a µLED pixel is the complexity of the circuitry used by each individual µLED pixel driver. For very small µLED pixels, the complexity and size of the µLED pixel driver becomes problematic. The complexity further increase as the bit resolution for the PWM signal increases.

An alternative approach is described herein whereby an analog control signal is applied to individual µLED pixel drivers to specify the duration of the PWM signal. The analog control signal is generated external to the individual pixel drive electronics.

In other embodiments, the use of an external waveform signal that is applied together with the analog control signal is described in detail herein. The waveform signal could be of any smoothly varying form, such as sinusoidal, but linear type waveforms have advantages, e.g. a triangular or linear sawtooth pulse waveform.

Figure 2:
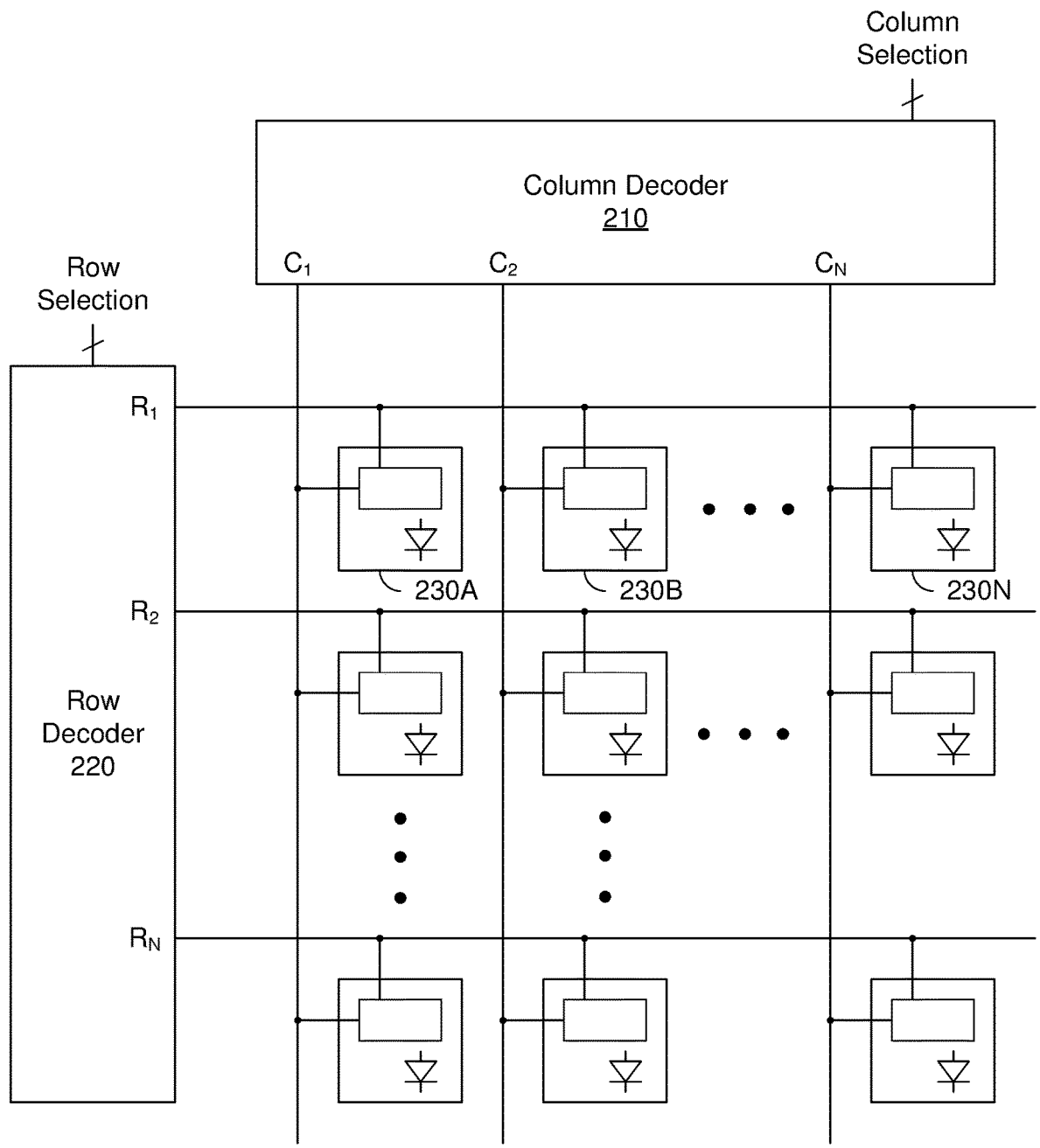
FIG. 2 illustrates a block diagram of a μLED display panel, according to one embodiment.

FIG. 2 illustrates a block diagram of a µLED display panel, according to one embodiment. The µLED display panel may include, among other components, a column decoder 210, a row decoder 220, and multiple µLED cells 230. The column decoder 210 selects or asserts one column of µLED cells of the display panel based on a column selection signal. In one embodiment, the column selection signal is generated by an n-bit counter. In this embodiment, the column selection decoder may be an n to $2^n$ decoder.

The row decoder 220 selects or asserts one row of µLED cells of the display panel based on a row selection signal. In some embodiments, the row selection signal is generated by an m-bit counter. In this embodiment, the row selection decoder may be an m to $2^m$ decoder.

The multiple µLED cells 230 are arranged in a grid pattern. In some embodiments, the µLED cells 230 are arranged in other patterns, such as, a circular pattern, an oval pattern. Each µLED cell 230 of the display panel is coupled to one output of the column decoder 210 and one output of the row decoder 220. As such, a specific µLED cell 230 may be addressed by asserting a specific output of the column decoder 210 and a specific output of the row decoder 220. For instance, µLED cell 230A is addressed by asserting column decoder output $C_1$ and row decoder output $R_1$, µLED cell 230B is addressed by asserting column decoder output $C_2$ and row decoder output $R_1$, µLED cell 230N is addressed by asserting column decoder output $C_N$ and row decoder output $R_1$, and so forth.

To increase the efficiency of the µLED display panel, the µLEDs are driven with a current density that is larger than a threshold value. In some embodiments, the threshold value is 300 A/cm². If a low luminance value is desired (e.g., in a dark scene of a video), instead of driving the µLED with a lower current density, the µLED is driven for a shorter amount of time, or using shorter emission bursts using the PWM scheme as described above with reference to FIG. 1C.

Figure 3A:
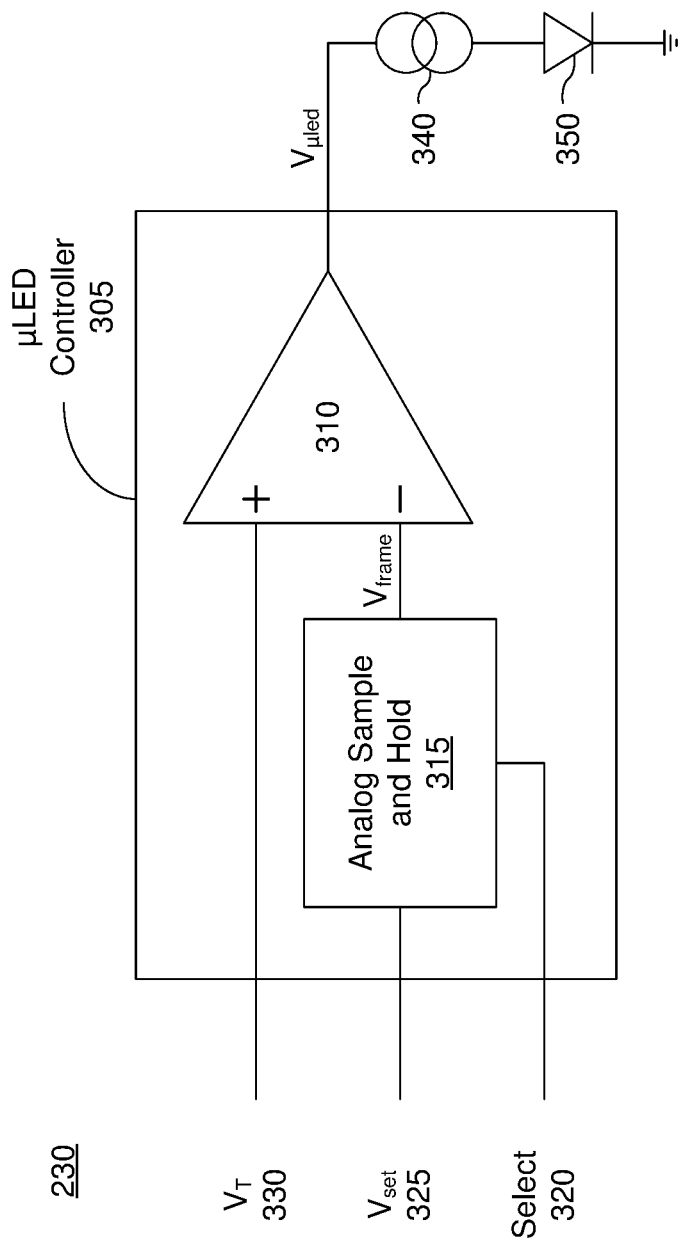
FIG. 3A illustrates a block diagram of a μLED cell, according to one embodiment.

FIG. 3A illustrates a block diagram of a µLED cell 230, according to one embodiment. The µLED cell 230 includes a µLED controller 305, a current source 340, and a µLED 350. The µLED controller 305 receives as an input a data signal ($V_{set}$) 325, a select signal 320, and a global control waveform signal ($V_T$) 330. In some embodiments, the select signal 320 is determined based on a column decoder output signal and a row decoder output signal. In some embodiments, the row decoder output signal determines the select signal 320 whilst the column output signal is the $V_{set}$ signal. In this embodiment, multiple digital-to-analog converters (DAC) are implemented as the column decoder. In other embodiments, the column decoder output signal determines the select signal 320 whilst the row output signal is the $V_{set}$ signal. In this embodiment, multiple DACs are implemented as the row decoder. The µLED controller 305 stores $V_{set}$ 325 when the select signal 220 is asserted. The µLED controller 305 then generates a driving signal based on the stored $V_{set}$ and the global control waveform signal 330. The driving signal generated by the µLED controller 305 has a set voltage amplitude and a duty cycle that is based on the value of $V_{set}$ 325. In some embodiments, the duty cycle of the driving signal increases as the value of $V_{set}$ 325 increases. In one embodiment, the duty cycle of the driving signal is proportional to the value of $V_{set}$ 325. In other embodiments, the duty cycle may be inversely proportional to the $V_{set}$ value.

The µLED controller 305 may include, among other components, an analog sample and hold module 315 and a comparator 310. The analog sample and hold 315 stores an analog value corresponding to the value of $V_{set}$. In some embodiments, the µLED controller receives a digital signal as the $V_{set}$ signal. In this embodiment, the µLED controller 305 further includes a digital-to-analog converter (DAC). In some embodiments, a single DAC is shared by multiple µLED cells. For example, a single DAC may be shared by all µLED cells in a column.

The comparator 310 compares the value of the $V_T$ signal and the output of the analog sample and hold module 315 and generates an output based on the comparison. The comparator 310 outputs a signal with a first voltage value when the $V_T$ signal is larger than the output of the analog sample and hold module 315, and a second voltage value when the $V_T$ signal is smaller than the output of the analog sample and hold module 315. In some embodiments, the comparator 310 is an operational amplifier (op-amp). In other embodiments the comparator 310 is a differential amplifier or a differential pair with sufficient gain to have a saturated output with very small differences in input voltage values.

The current source 340 receives the driving signal and generates a driving current for driving the μLED 350. In some embodiments, the current source 340 includes a driving transistor that turns on or off based on the driving signal received from the μLED controller 305. In this embodiment, a gate terminal of the driving transistor is controlled by the driving signal, a drain terminal of the driving transistor is coupled to a power supply voltage, and the source terminal of the driving transistor is coupled to the μLED 350. In some embodiments, the amplitude of the driving current is chosen so that the current density of μLED is equal or substantially equal to $J^{*'}$. In other embodiments, the amplitude of the driving signal is chosen so that the current density of the μLED 350 is greater than $J^{*'}$. The μLED 350 then receives the driving current and emits light accordingly.

Figure 3B:
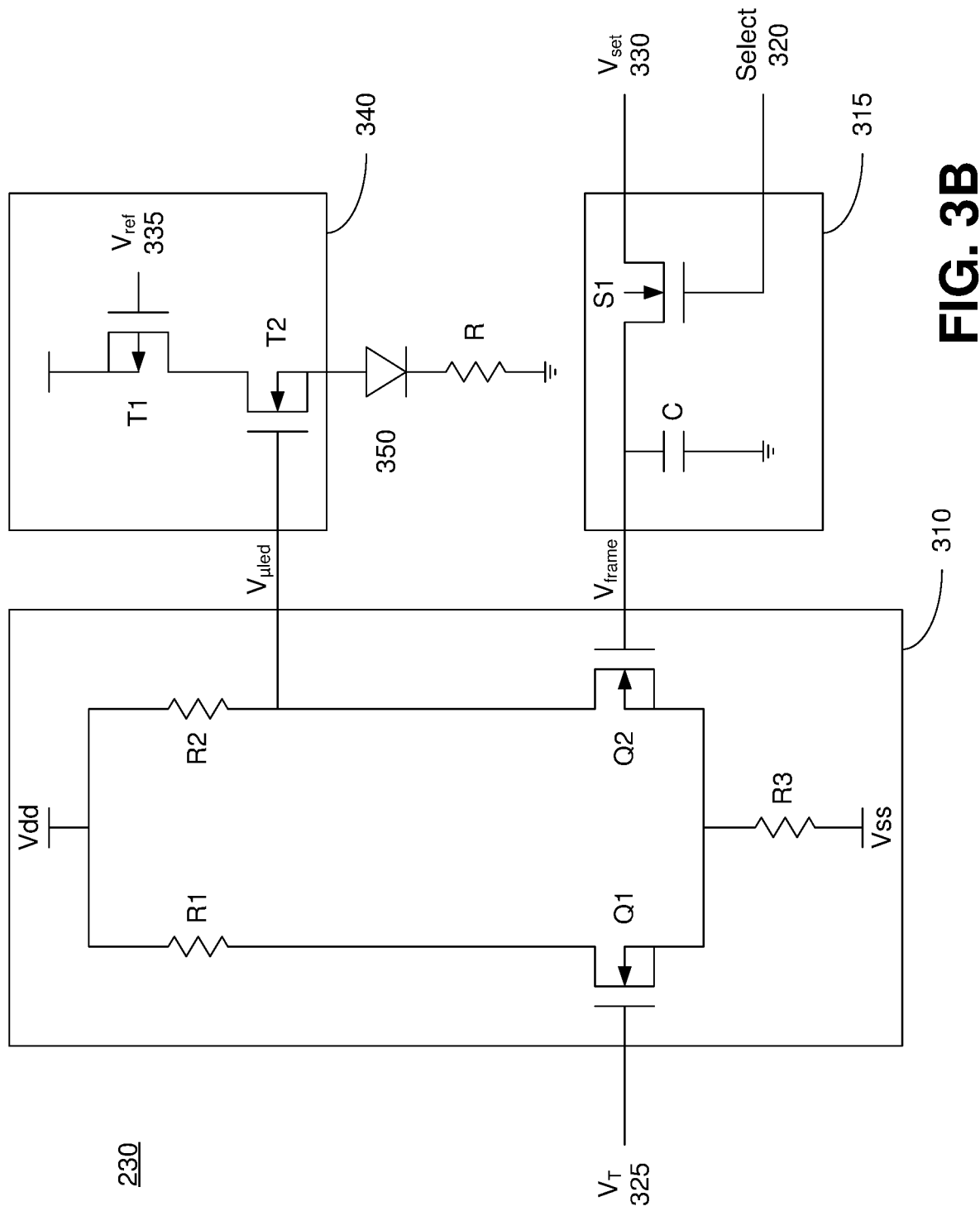
FIG. 3B illustrates a circuit diagram of a μLED cell, according to one embodiment.

FIG. 3B illustrates a circuit diagram of a μLED cell 230, according to one embodiment. The analog sample and hold module 315 includes a sampling transistor (or sampling switch) Si and a holding capacitor C. The sampling transistor Si is controlled by the select signal 320. The sampling transistor charges holding capacitor C to the value of $V_{set}$ when the select signal is asserted. The holding capacitor C then holds the value of $V_{set}$ when the select signal 320 is not asserted. In some implementations, the holding capacitor C could be the gate capacitance of the next transistor in the circuit, in the case of FIG. 3B, this would be the gate of transistor Q2.

The comparator 310 includes a differential pair. Each half of the differential pair includes a resistor and a transistor. The differential pair of comparator 310 shown in FIG. 3B includes a first resistor R1, a first transistor Q1, a second resistor R2, and a second transistor Q2. The first resistor R1 is coupled between a first voltage source (Vdd) and the drain of first transistor Q1. The second resistor R2 is coupled between Vdd and the drain of the second transistor Q2. In some embodiments, the second resistor R2 has higher resistance value than the first resistor R1.

In some embodiments, the resistors R1, R2, and R3 are implemented using transistors (e.g., diode connected transistors). In other embodiments, a current source is used instead of the third resistor R3. In other embodiments, all resistors could be implemented using current source sub-circuitry e.g. current mirrors.

The gate of the first transistor Q1 is coupled to $V_T$ and the gate of the second transistor Q2 is coupled to the output of the analog sample and hold module 315.

The comparator 310 further includes a third resistor R3 coupled to the source of the first and second transistors Q1 and Q2. The third resistor R3 is further coupled to a second voltage source (Vss). In some embodiments, the second voltage source is ground. In other embodiments, the second voltage source has a negative voltage with respect to ground.

In some embodiments, the resistors R1, R2, and R3 are implemented using transistors (e.g., diode connected transistors). In other embodiments, a current source is used instead of the third resistor R3. In some embodiments, additional transistors are used to increase the gain of the differential pair. In one embodiment, the differential pair is designed to have a gain of at least 10 but preferably at least 30. The differential pair may be designed to provide fast switching with high gain while compromising common mode rejection and linearity.

The current source 340 illustrated in FIG. 3B is a switched current source. The switched current source 340 includes a p-type transistor (e.g., a PMOS) T1 and an n-type transistor (e.g., an NMOS) T2. The gate of the n-type transistor T2 is coupled to the output of the comparator 310. The n-type transistor T2 is coupled between the drain of the p-type transistor T1 and the μLED 350. When the output of the comparator 310 is above a threshold value, the n-type transistor T20 is turned on and a current is supplied to the μLED 350. In some embodiments, a second p-type transistor is used instead of the n-type transistor T2.

The amplitude of the current supplied to the μLED 350 is controlled by p-type transistor T1. The p-type transistor is controlled by a reference voltage $V_{ref}$. In some embodiments, the reference voltage $V_{ref}$ represents the control voltage from half of a current mirror, the other half of the current mirror being located remote from the driver cell 305. The p-type transistor T1 is further coupled between a supply voltage and the drain of the n-type transistor T2. In some embodiments, the μLED 350 may comprise one element of a μLED array with a common anode connected to a positive supply voltage. In this embodiment, the cathode of μLED 350 is connected to n-type transistor T2 which provides a switchable link to a fixed current sink formed by transistor T1 to ground, set using $V_{ref}$. In this embodiment, transistor T1 is an n-type transistor, and hence, the entire circuit may be implemented using n-type transistors.

Figure 4:
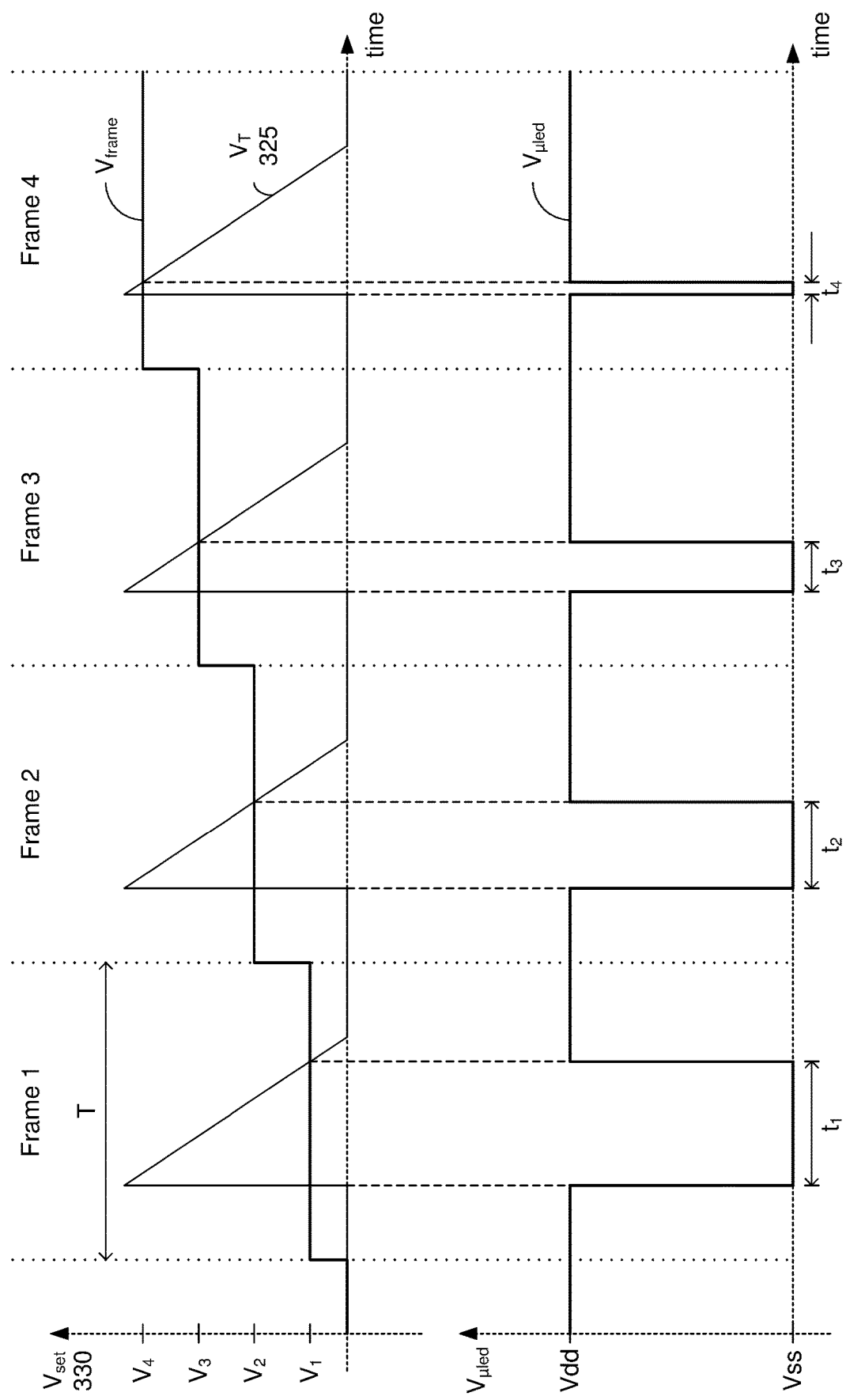
FIG. 4 illustrates a timing diagram of several PWM signals for different data inputs, according to one embodiment.

FIG. 4 illustrates a timing diagram of several PWM signals for different data inputs, according to one embodiment. The timing diagram of FIG. 4 illustrates a data signal $V_{set}$ having four different values ($V_1$ through $V_4$) during four consecutive frames (frame 1 through frame 4). During frame 1, the data voltage $V_{set}$ has a value of $V_1$. At the beginning of the frame, the select signal 320 is enabled and the capacitor C is charged to the value of $V_{set}$. As such, the value of $V_{frame}$ is substantially equal to $V_1$.

During the frame, a sawtooth pulse is provided to comparator 310 as the global control waveform signal ($V_T$). The comparator compares the voltage value of the sawtooth pulse ($V_T$) and the voltage value of $V_{frame}$ and outputs a signal that has a first voltage value (e.g., a HI level) when the voltage value of $V_{frame}$ is larger than the voltage value of $V_T$, and has a second voltage value (e.g., a LO level) when the voltage value of $V_T$ is larger than the voltage value of $V_{frame}$. If the decay of the sawtooth pulse ($V_T$) is linear, the amount of time the output of the comparator is at the second voltage level is proportional to the difference between the amplitude of the sawtooth pulse and the value of $V_{frame}$. For instance, if the amplitude of the sawtooth wave is $|V_T|$ and the slope of the sawtooth wave is m, then, the amount of time t the output of the comparator is at the second voltage level is:

$$t = \frac{|V_T| - V_{frame}}{m}$$

Thus, the amount of time t' the output of the comparator is at the first voltage level is:

$$t' = T - \frac{|V_T| - V_{frame}}{m}$$

Similarly, during the frame 2, the data voltage $V_{set}$ has a value of $V_2$ and when the select signal 320 is provided to the analog sample and hold module 315, the capacitor is charged until the value of $V_{frame}$ is substantially equal to $V_2$. As shown in the FIG. 4, the since the value of $V_2$ is larger than $V_1$, the length $t_2$ of the pulse of $V_{\mu led}$ during frame 2 is shorter than the length $t_2$ of the pulse of $V_{\mu led}$ during frame 1. Similarly, the length of the pulse of $V_{\mu led}$ during frames 3 and 4 are correlated to the voltage level of the data voltage $V_{set}$.

Figure 5:
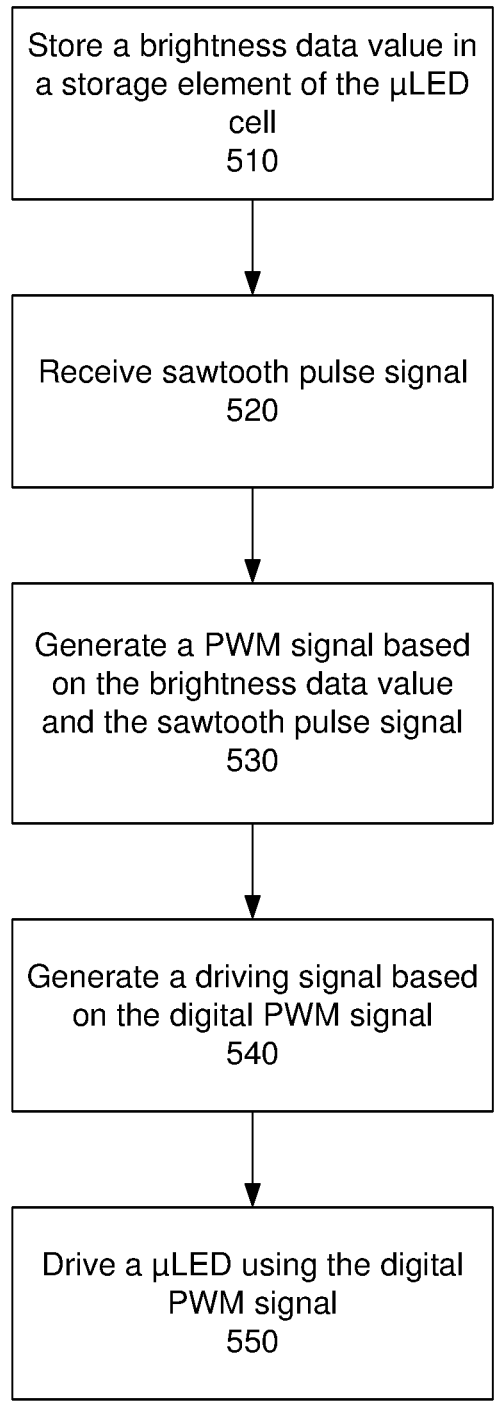
FIG. 5 illustrates a flow diagram of a method for operating a μLED cell, according to one embodiment.

FIG. 5 illustrates a flow diagram of a method for operating a μLED cell, according to one embodiment. The μLED cell 230 receives a brightness data value and stores 510 the brightness data value in a storage element, such as capacitor C of FIG. 3B. In some embodiments, the brightness data value is stored in response to the select signal 335. The μLED cell 230 further receives 520 a sawtooth pulse signal ($V_T$). The μLED cell 230 generates 530 a PWM signal based on the brightness data value and the sawtooth pulse signal. The PWM is generated by comparing the voltage values of the stored brightness data value and the sawtooth pulse signal.

A driving signal is generated 540 based on the PWM signal. In some embodiments, the driving signal is generated by a current source that generates a driving current based on the PWM signal. A μLED is driven 550 based on the generated driving signal. The μLED then emits light with an average brightness that is proportional to the brightness data value.

Alternative Embodiments

Figure 6A:
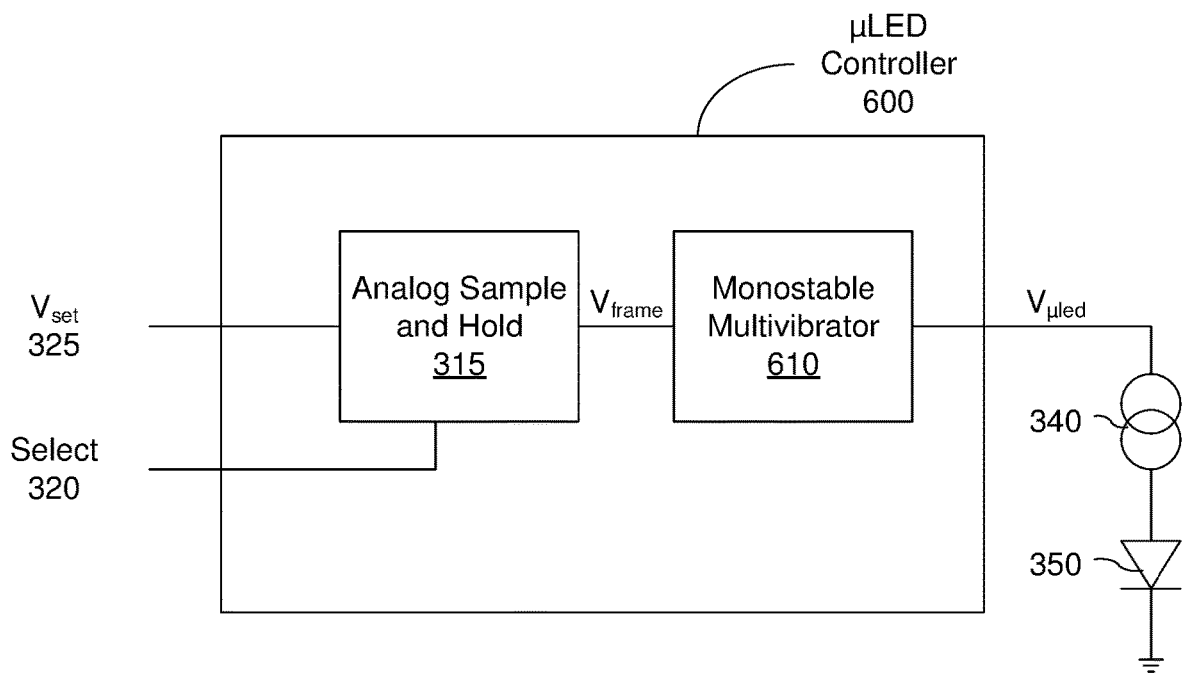
FIGS. 6A through 6C illustrate other embodiments of the μLED cell.
Figure 6B:
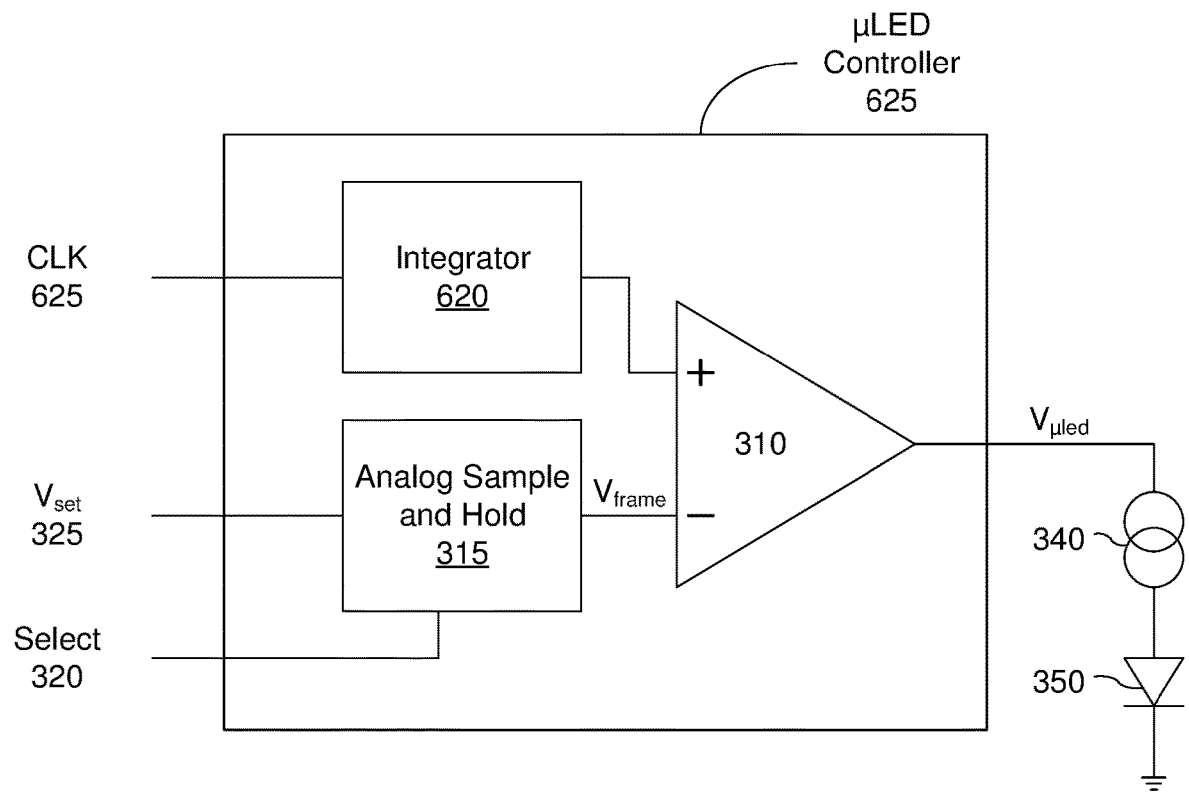
Figure 6C:
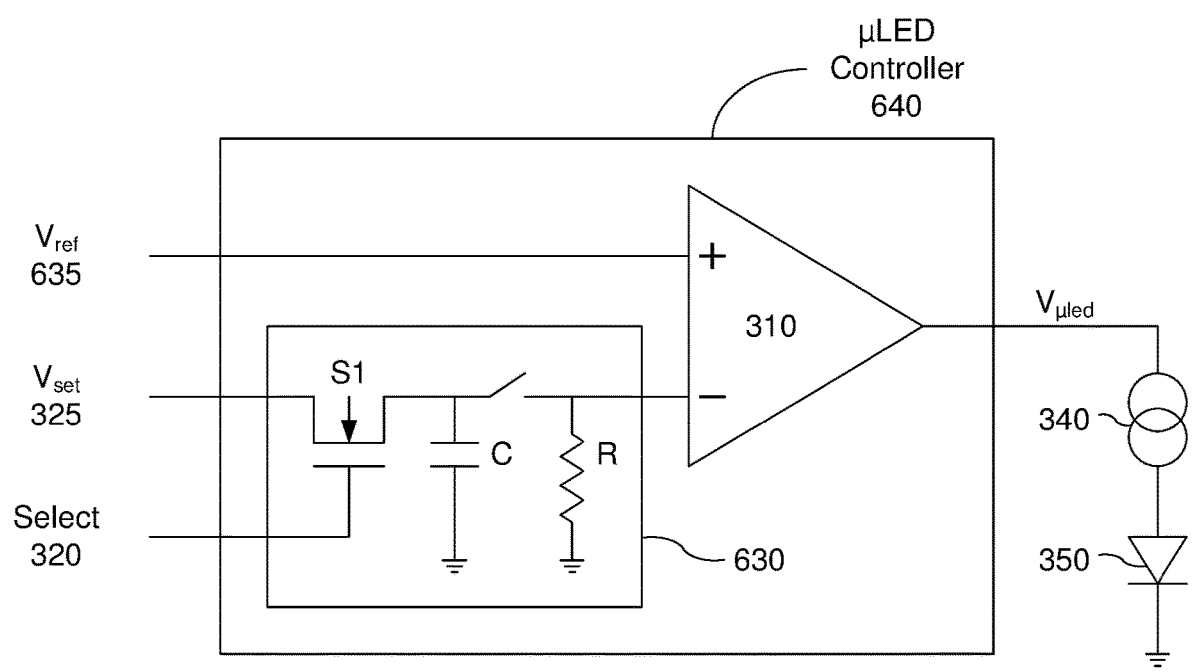

FIGS. 6A through 6C illustrate other embodiments of the μLED cell 230. In FIG. 6A, the output of the analog sample and hold 315 is provided in a μLED controller 600 is provided to a monostable multivibrator 610. The 'on' time of the monostable multivibrator is the controlled based on the value of $V_{frame}$. That is the monostable multivibrator is triggered to be in the "unstable" state by the $V_{frame}$ voltage, and the amount of time before returning to the "stable" state is proportional to the value of $V_{frame}$.

FIG. 6B illustrates a μLED controller 625 with a local integrator 620 that receives a clock (CLK) signal 625, according to one embodiment. The integrator 620 integrates the CLK 625 to generate a control waveform signal. The control waveform signal is then provided to the comparator 310 to be compared with $V_{frame}$ for generating the $V_{\mu led}$ voltage.

FIG. 6C illustrates a μLED controller 640 a modified analog sample and hold 630 that includes a resistor R in parallel with holding capacitor C. In some embodiments, the analog sample and hold 630 further includes a switch for controlling when to provide the voltage of holding capacitor C to the comparator 310. Furthermore, instead of receiving a global control waveform signal $V_T$, the comparator 310 receives a predetermined reference voltage ($V_{ref}$) 635.

When the select signal is asserted, the holding capacitor C is charged to have an output voltage substantially equal to $V_{set}$. Then, when the voltage of the holding capacitor C is provided to the comparator for generating the μLED driving signal $V_{\mu led}$. As the voltage of holding capacitor C is being provided to the comparator 310, the capacitor is discharged through resistance R, thus, reducing the value of the voltage being provided by holding capacitor C as a function of time. Therefore, width of the pulse of $V_{\mu led}$ may be controlled based on the value of $V_{set}$ and the RC constant of the combination of the holding capacitor C and resistor R. In some embodiments, instead of having a discrete capacitor, the gate capacitance of the transistor Q2 is used as capacitor C.

Brightness Control

In one embodiment, the brightness range of the μLED is controlled by modifying the range of output voltages for the digital-to-analog converter (DAC) used to generate the data signal $V_{set}$. For instance, a voltage range of 1V may be used when the μLED is to be used with full brightness range and a voltage range of 0.5V is used when the μLED is to be used with 50% brightness range. That is, for an 8-bit digital signal, if the digital signal has a value of 255, when the μLED is used at full brightness range the DAC would produce a $V_{set}$ of 1V, and when the μLED is used at half brightness range, the DAC would produce a $V_{set}$ of 0.5V. Similarly, if the digital signal has a value of 128, when the μLED is used at full brightness range the DAC would produce a $V_{set}$ of 0.5V, and when the μLED is used at half brightness range, the DAC would produce a $V_{set}$ of 0.25V.

In one embodiment, an offset is added to the output of the DAC such that the even when the range of the DAC is reduced, the DAC outputs a voltage level equal to a supply voltage (VCC) when a maximum brightness data value is provided as an input. For example, if the DAC is used at half range, the output of the DAC may have a range from 0.5V when the data value is 0, to 1V when the data value is 255.

In another embodiment, the brightness range of the μLED is controlled by modifying the duration of the global control waveform pulse $V_T$. That is, while keeping the frequency or period of the global control waveform signal constant (e.g., 60 Hz), the duration of the global control waveform pulse $V_T$ within a period of the global control waveform signal is reduced to reduce the brightness range of the μLED or increased to increase the brightness range of the μLED.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A light-emitting-diode (LED) display device comprising:
   a LED disposed within a cell of the LED display device, the LED configured to emit light; and
   a controller disposed within the cell of the LED display device, the controller receiving an analog brightness control data signal corresponding to a desired brightness of the LED, and generating a driving signal having a fixed amplitude and a varying duration corresponding to an amplitude of the analog brightness control data signal, the controller comprising:
      a sample and hold circuit configured to receive the analog brightness control data signal, and store the analog brightness control data signal as a frame brightness signal in a storing element responsive to receiving a select signal having a predetermined value, wherein the received analog brightness control data signal is not based on a voltage at a terminal of the LED, and
      a comparator circuit having an input coupled to an output of the sample and hold circuit, the comparator circuit configured to receive the frame brightness signal and a control waveform signal, and generate the driving signal based on a comparison between a voltage level of the frame brightness signal and a voltage level of the control waveform signal, wherein the control waveform signal is a periodic signal that changes from a first value to a second value within each display frame; and a switched current source configured to receive the driving signal and generate a driving current based on the driving signal for driving the LED, the driving current having a fixed amplitude and a varying duration corresponding to the amplitude of the analog brightness control data signal.

2. The LED display device of claim 1, wherein the sample and hold circuit comprises:
a sampling switch receiving the analog brightness control data signal, the sampling switch configured to turn on and off based on the select signal; and
a holding capacitor coupled to an output of the sample switch, the holding capacitor configured to store the analog brightness control data signal as the frame brightness signal responsive to the sample switch being on.

3. The LED display device of claim 1, wherein the comparator circuit comprises:
a differential pair including a first transistor receiving the frame brightness signal, and a second transistor receiving the control waveform signal.

4. The μLED display device of claim 1, wherein the control waveform signal includes one of a plurality of linear features and a nonlinear periodic waveform.

5. The LED display device of claim 1, wherein the controller further comprises:
a digital-to-analog converter (DAC) configured to receive a digital brightness data signal and convert the digital brightness data signal to the analog brightness signal, an output of the DAC coupled to an input of the sample and hold circuit.

6. The LED display device of claim 1, wherein the switched current source comprises a transistor that is configured to turn on and off based on the output of the controller.

7. A light emitting diode (LED) driver circuit comprising:
a controller receiving a brightness data signal corresponding to a desired brightness of the LED, and generating a driving signal corresponding to the brightness data signal, the controller comprising:
a sample and hold circuit configured to receive the brightness data signal, and store the brightness data signal as a frame brightness signal in a storing element responsive to receiving a select signal having a predetermined value, wherein the received brightness data signal is not based on a voltage at a terminal of the LED, and
a comparator circuit having an input coupled to an output of the sample and hold circuit, the comparator circuit configured to receive the frame brightness signal and a control waveform signal, and generate the driving signal based on a comparison between a voltage level of the frame brightness signal and a voltage level of the control waveform signal, wherein the control waveform signal is a periodic signal that changes from a first value to a second value within each display frame; and
a switched current source configured to receive the driving signal and generate a driving current based on the driving signal for driving the LED.

8. The LED display device of claim 7, wherein the LED is driven with a current density above 1 A/cm$^2$.

9. The LED display device of claim 7, wherein the sample and hold circuit comprises:
a sampling switch receiving the brightness data signal, the sampling switch configured to turn on and off based on the select signal; and
a holding capacitor, the holding capacitor coupled to an output of the sample switch, the holding capacitor configured to store the brightness data signal as the frame brightness signal responsive to the sample switch being on.

10. The LED display device of claim 7, wherein the comparator comprises:
a differential pair including a first transistor receiving the frame brightness signal, and a second transistor receiving the control waveform signal.

11. The LED display device of claim 7, wherein the control waveform signal includes a plurality of sawtooth pulses.

12. The LED display device of claim 7, wherein the controller further comprises:
a digital-to-analog converter (DAC), configured to receive a digital brightness data signal and generate the brightness data signal provided to the sample and hold circuit by converting the digital brightness data signal to an analog signal, an output of the DAC coupled to an input of the sample and hold circuit.

13. The LED display device of claim 7, wherein the switched current source comprises a transistor that is configured to turn on and off based on the output of the controller.

14. A method for operating a light-emitting-diode (LED) of an LED display device, the LED display device displaying images in display frames, comprising:
receiving a digital brightness data signal corresponding to a desired brightness of the LED in a subsequent display frame;
converting the digital brightness data signal to an analog brightness data signal;
storing the analog brightness data signal as a frame brightness signal responsive to receiving a select signal having a predetermined value, wherein the stored analog brightness data signal is not based on a voltage at a terminal of the LED;
receiving a sawtooth pulse signal;
generating a control signal by comparing the stored frame brightness signal and the sawtooth pulse signal, wherein the sawtooth pulse signal is a periodic signal that changes from a first value to a second value within each display frame;
generating a driving current having a fixed amplitude and a varying duration based on the generated control signal, the duration of the generated driving current corresponding to an amplitude of the analog brightness data signal; and
driving the LED using the generated control signal.

15. The method of claim 14, wherein the control signal has a preset amplitude.

16. The method of claim 14, further comprising:
turning a sampling switch based on a sample signal, the sampling switch for providing the analog brightness data signal to a holding capacitor when the sampling switch is on;
storing the analog brightness data signal in the holding capacitor, wherein the received frame brightness signal is a voltage level of the holding capacitor.

17. The method of claim 14, wherein the LED is driven with a current density above 1 A/cm$^2$.

18. The LED display device of claim 1, wherein the analog brightness control data signal is a signal external to an individual pixel drive electronics.

19. The LED display device of claim 1, wherein the analog brightness control data signal is a desired brightness of the LED in a subsequent display frame.

20. The LED display device of claim 1, the first value is larger than the second value, and wherein the control waveform signal decreases from the first value to the second value within each display frame of the LED display device.

* * * * *